US012622290B2

(12) United States Patent
Ting et al.

(10) Patent No.: US 12,622,290 B2
(45) Date of Patent: May 5, 2026

(54) CHIP STRUCTURE AND METHOD OF FABRICATING THE SAME

(71) Applicant: Taiwan Semiconductor Manufacturing Company, Ltd., Hsinchu (TW)

(72) Inventors: Kuo-Chiang Ting, Hsinchu (TW); Jian-Wei Hong, Hsinchu (TW); Sung-Feng Yeh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 543 days.

(21) Appl. No.: 18/152,153

(22) Filed: Jan. 10, 2023

(65) Prior Publication Data

US 2024/0088048 A1 Mar. 14, 2024

Related U.S. Application Data

(60) Provisional application No. 63/405,893, filed on Sep. 13, 2022.

(51) Int. Cl.
H01L 23/538 (2006.01)
H01L 21/48 (2006.01)
(Continued)

(52) U.S. Cl.
CPC ...... H01L 23/5383 (2013.01); H01L 21/4853 (2013.01); H01L 21/4857 (2013.01); (Continued)

(58) Field of Classification Search
CPC ............. H01L 23/5383; H01L 23/3121; H01L 23/5386; H01L 23/49816; H01L 23/544; H01L 23/5385; H01L 21/4853; H01L 21/4857; H01L 21/6835; H01L 24/05; H01L 24/08; H01L 24/80; H01L 24/06; H01L 24/97; H01L 25/0652; H01L 25/0655; H01L 25/50; H01L 2224/0557; H01L 2224/05571; H01L 2224/05647; H01L 2224/06181; H01L 2224/08145; (Continued)

(56) References Cited

U.S. PATENT DOCUMENTS 8,993,380 B2 3/2015 Hou et al.
9,281,254 B2 3/2016 Yu et al.
(Continued)

*Primary Examiner* — Marlon T Fletcher
*Assistant Examiner* — Christina A Sylvia
(74) *Attorney, Agent, or Firm* — JCIPRNET

(57) ABSTRACT

A chip structure provided herein includes a bridge structure including an interconnect bridge, a dielectric layer laterally surrounding the interconnect bridge and through dielectric vias extending from a top of the dielectric layer to a bottom of the dielectric layer, wherein a thickness of the interconnect bridge is identical to a height of each of the through dielectric vias; semiconductor dies disposed on the bridge structure, wherein each of the semiconductor dies overlaps both the interconnect bridge and the dielectric layer and is electrically connected to the interconnect bridge and at least one of the through dielectric vias; and a die support, the semiconductor dies being disposed between the die support and the bridge structure, wherein a sidewall of the die support is coplanar with a sidewall of the bridge structure.

20 Claims, 16 Drawing Sheets

(51) Int. Cl.
　　*H01L 23/00*　　　　(2006.01)
　　*H01L 23/31*　　　　(2006.01)
　　*H01L 25/065*　　　 (2023.01)

(52) U.S. Cl.
　　CPC ...... *H01L 23/3121* (2013.01); *H01L 23/5386*
　　　　(2013.01); *H01L 24/05* (2013.01); *H01L 24/08*
　　　　(2013.01); *H01L 24/80* (2013.01); *H01L*
　　　　*25/0652* (2013.01); *H01L 25/0655* (2013.01);
　　　　*H01L 24/06* (2013.01); *H01L 24/97* (2013.01);
　　　　*H01L 2224/0557* (2013.01); *H01L 2224/05571*
　　　　(2013.01); *H01L 2224/05647* (2013.01); *H01L*
　　　　*2224/06181* (2013.01); *H01L 2224/08145*
　　　　(2013.01); *H01L 2224/08237* (2013.01); *H01L*
　　　　*2224/80357* (2013.01); *H01L 2224/80379*
　　　　(2013.01); *H01L 2224/80447* (2013.01); *H01L*
　　　　*2224/97* (2013.01); *H01L 2924/0504*
　　　　(2013.01); *H01L 2924/0544* (2013.01); *H01L*
　　　　*2924/059* (2013.01)

(58) Field of Classification Search
　　CPC . H01L 2224/08237; H01L 2224/80357; H01L
　　　　2224/80379; H01L 2224/80447; H01L
　　　　2224/97; H01L 2224/80895; H01L
　　　　2224/80896; H01L 2924/0504; H01L
　　　　2924/0544; H01L 2924/059; H01L
　　　　2221/68318; H01L 2221/68368; H01L
　　　　2221/68345; H01L 2223/54426; H01L
　　　　2223/54486; H01L 2223/06524; H01L
　　　　2223/06541; H01L 2223/06565
　　See application file for complete search history.

(56)　　　　　　　References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,607,967 B1 * | 3/2017 | Shih | H01L 21/6835 |
| 9,666,502 B2 | 5/2017 | Chen et al. | |
| 9,735,131 B2 | 8/2017 | Su et al. | |
| 2018/0211929 A1 * | 7/2018 | Bae | H01L 25/0655 |
| 2020/0006324 A1 * | 1/2020 | Chen | H01L 24/09 |

* cited by examiner

CHIP STRUCTURE AND METHOD OF FABRICATING THE SAME

CROSS-REFERENCE TO RELATED APPLICATION

This application claims the priority benefit of U.S. provisional application Ser. No. 63/405,893, filed on Sep. 13, 2022. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. Multiple electronic components such as integrated circuit dies may also require to be packaged integrally, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
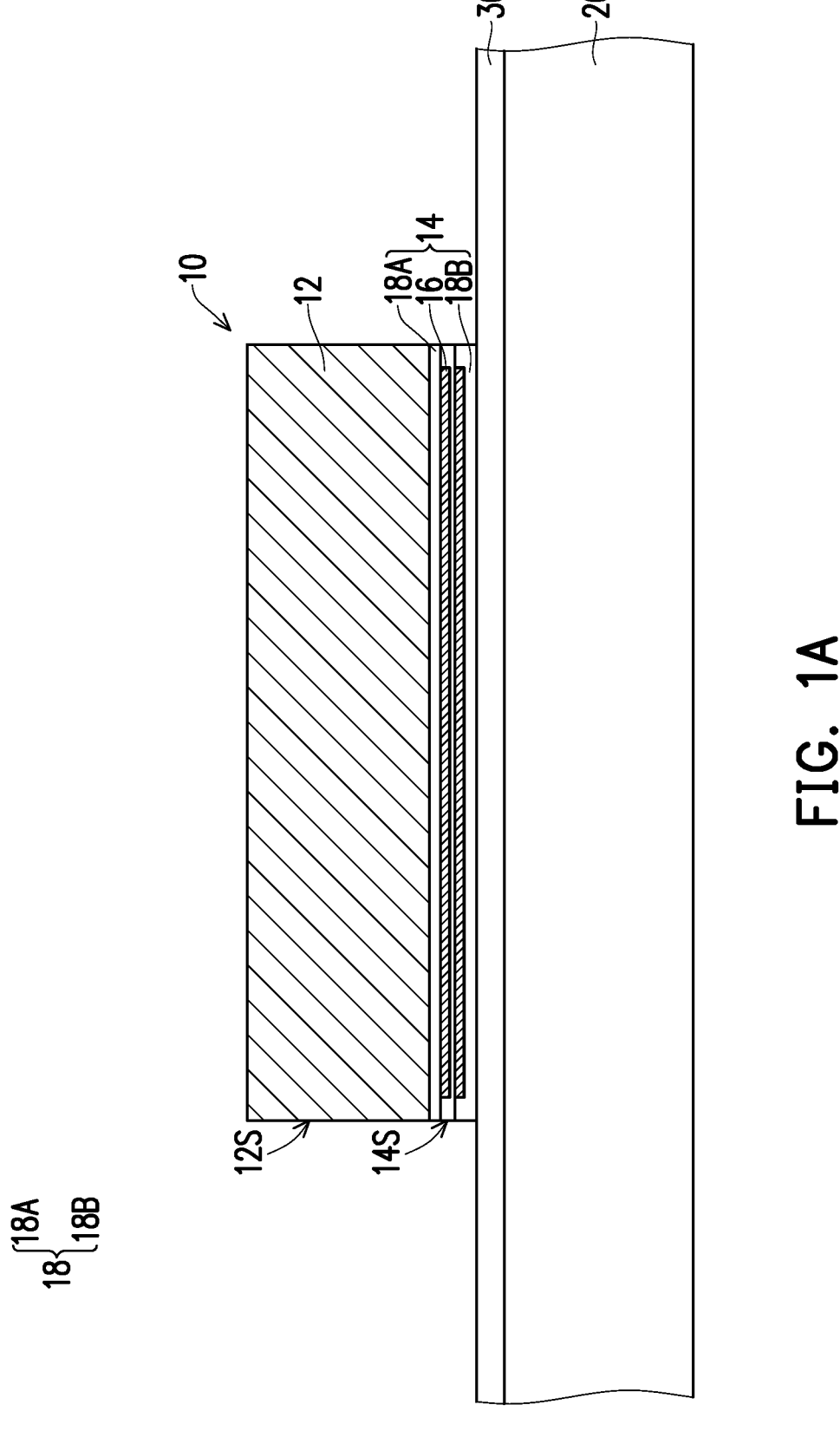
FIGS. 1A through 1L schematically illustrate respective steps of fabricating a chip structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Packages and the methods of forming the same are provided in accordance with various exemplary embodiments. The intermediate stages of forming the packages are illustrated. The variations of the embodiments are discussed. Throughout the various views and illustrative embodiments, like reference numbers are used to designate like elements.

FIGS. 1A through 1L schematically illustrate respective steps of fabricating a chip structure in accordance with some embodiments of the disclosure. In FIG. 1A, a bridge die 10 is placed on a carrier 20. In some embodiments, an interface layer 30 is formed on the carrier 20 before placing the bridge die 10 on the carrier 20 and the bridge die 10 is attached to the carrier 20 through the interface layer 30. In other words, the bridge die 10 is in contact with the interface layer 30. The interface layer 30 includes a temporary adhesive that adhere the bridge die 10 to the carrier 20 and allows the carrier 20 to be separated from the bridge die 10. The interface layer 30 extends on an entire of the surface of the carrier 20 facing the bridge die 10. In some embodiments, the carrier 20 is a wafer form substrate and is larger than the bridge die 10. In some embodiments, multiple bridge dies 10 are placed on the carrier 20 for fabricating the required chip structure. In some embodiments, the carrier 20 is used for fabricating one or more chip structures.

The bridge die 10 is preformed and singulated from a mother wafer (not shown) and is picked and placed on the carrier 20. The bridge die 10 includes a semiconductor substrate 12 and an interconnect bridge 14 disposed on the semiconductor substrate 12. The outline of the semiconductor substrate 12 is optionally conformed to the outline of the interconnect bridge 14. The bridge die 10 is oriented that the interconnect bridge 14 faces to the carrier 20 and is in contact with the interface layer 30. In some embodiments, the sidewall 12S of the semiconductor substrate 12 is coplanar with the sidewall 14S of the interconnect bridge 14. In some embodiments, the semiconductor substrate 12 includes a semiconductor material. In some embodiments, the semiconductor substrate 12 is a bare substrate which is a substantially homogeneous substrate without an electronic component formed therein. The interconnect bridge 14 includes interconnect wirings 16 and interlayer dielectric layers 18, and the interlayer dielectric layers 18 isolate adjacent two layers of the interconnect wirings 16 so that the interconnect wirings 16 build the required electric transmission paths. In some embodiments, the material of the interlayer dielectric layers 18 may include silicon oxide ($SiO_x$, where x>0), silicon nitride ($SiN_x$, where x>0), silicon oxynitirde ($SiO_xN_y$, where x>0 and y>0) or other suitable dielectric material. The interconnect wirings 16 may include metallic wirings. For example, the interconnect wirings 16 include copper wirings, copper pads, aluminum pads or combinations thereof.

In some embodiments, the electric transmission paths built by the interconnect wirings 16 do not extend to the semiconductor substrate 12. Namely, no electric connection is established between the interconnect wirings 16 and the semiconductor substrate 12. In some embodiments, the interlayer dielectric layer 18A immediately adjacent to the semiconductor substrate 12 and the interlayer dielectric layer 18B in contact with the interface layer 30 are optionally blank layers covering the entire surface of the semiconductor substrate 12, but the disclosure is not limited thereto. In some embodiments, the semiconductor substrate 12 serves as a carrier for forming and temporarily carrying the interconnect bridge 14.

Figure 1B:
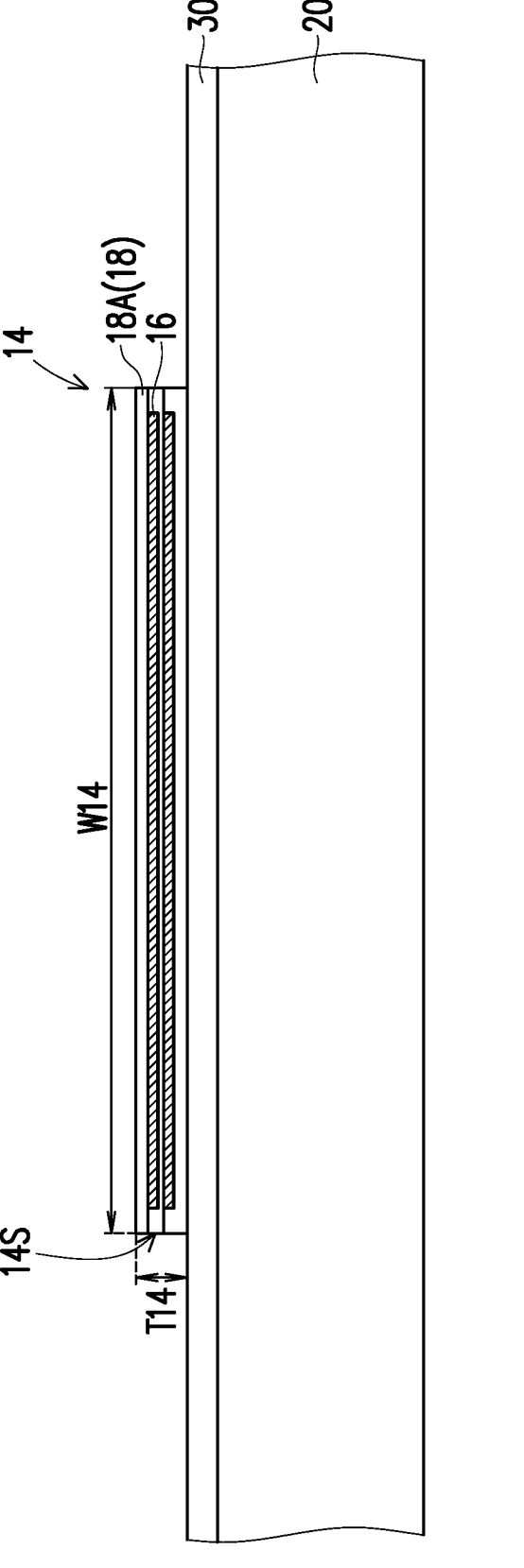

In FIG. 1B, the semiconductor substrate 12 is removed and the interconnect bridge 14 remains on the carrier 20. In some embodiments, the semiconductor substrate 12 is removed by performing a Chemical Mechanical Polish (CMP) process and/or a mechanical grinding process until the interlayer dielectric layer 18A is exposed. The interconnect bridge 14 is constructed by multiple patterned conductive layers (the interconnect wirings 16) and multiple dielectric layers (the interlayer dielectric layers 18) and has a small volume. In some embodiments, the width W14 of the interconnect bridge 14 is 100 micrometers to 3 millimeters. In some embodiments, the interconnect wirings 16 are encircled by the interlayer dielectric layers 18 and keep a space from edges of the interlayer dielectric layers 18. Therefore, the interconnect wirings 16 are spaced from the sidewall 14S of the interconnect bridge 14 without being exposed at the sidewall 14S.

Figure 1C:
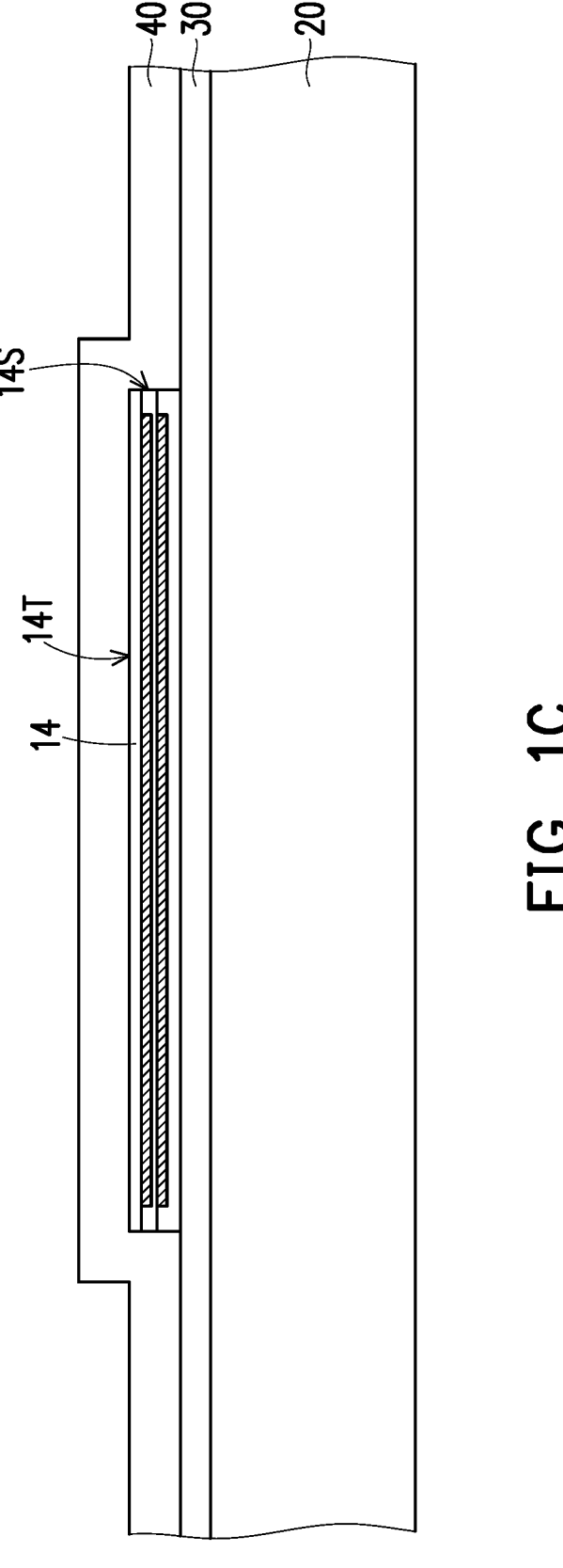

In FIG. 1C, a dielectric material layer 40 is formed on the carrier 20 to cover the interconnect bridge 14. The dielectric material layer 40 covers over the entire surface of the carrier 20. The dielectric material layer 40 covers the top 14T and the sidewall 14S of the interconnect bridge 14 and also covers the interface layer 30. In some embodiments, the dielectric material layer 40 include an oxide, such as silicon oxide. In some alternative embodiments, the material of the dielectric material layer 40 may be organic material (e.g., epoxy, polyimide (PI), polybenzoxazole (PBO), or the like), or the mixture of inorganic and organic materials (e.g., the mixture of silicon oxide and epoxy, or the like). In some alternative embodiments, the material of the dielectric material layer 40 may include a molding compound, a molding underfill, a resin (such as epoxy resin), or the like. In some embodiments, the dielectric material layer 40 may be formed through suitable fabrication techniques such as CVD, HDPCVD, PECVD, or atomic layer deposition (ALD). In some alternative embodiments, the dielectric material layer 40 may be formed by a molding process, such as a compression molding process.

Figure 1D:
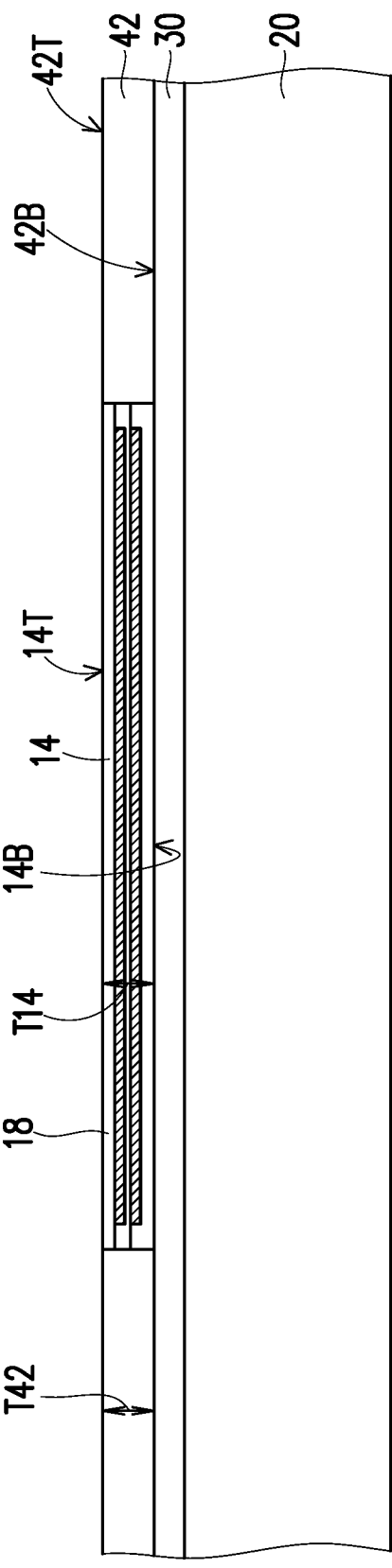

In FIG. 1D, a planarization operation is performed until the interconnect bridge 14 is exposed. The dielectric material layer 40 is reduced to form the dielectric layer 42 beside the interconnect bridge 14. The dielectric layer 42 laterally surrounds the interconnector bridge 14. In some embodiments, the top 14T of the interconnect bridge 14 and the top 42T of the dielectric layer 42 are coplanar. In addition, since the interconnect bridge 14 and the dielectric layer 42 are disposed on the interface layer 30, the bottom 14B of the interconnect bridge 14 such as the bottom of one of the interlayer dielectric layers 18 is co-leveled with the bottom 42B of the dielectric layer 42. In some embodiments, the thickness T14 of the interconnect bridge 14 is substantially identical to the thickness T42 of the dielectric layer 42. In some embodiments, the material of the interlayer dielectric layers 18 of the interconnect bridge 14 is different from the material of the dielectric layer 42. In some embodiments, the material of the interlayer dielectric layers 18 of the interconnect bridge 14 is the same as the material of the dielectric layer 42. In some embodiments with multiple interconnect bridges 14 attached onto the carrier 20, the dielectric layer 42 extends between the multiple interconnect bridges 14 to fill the gap between the interconnect bridges 14. Accordingly, the dielectric layer 42 is served as a gap fill material. In addition, the structure with the dielectric layer 42 surrounding the interconnect bridge 14 may be a wafer form structure and may be cut to a chip form in the subsequent steps.

Figure 1E:
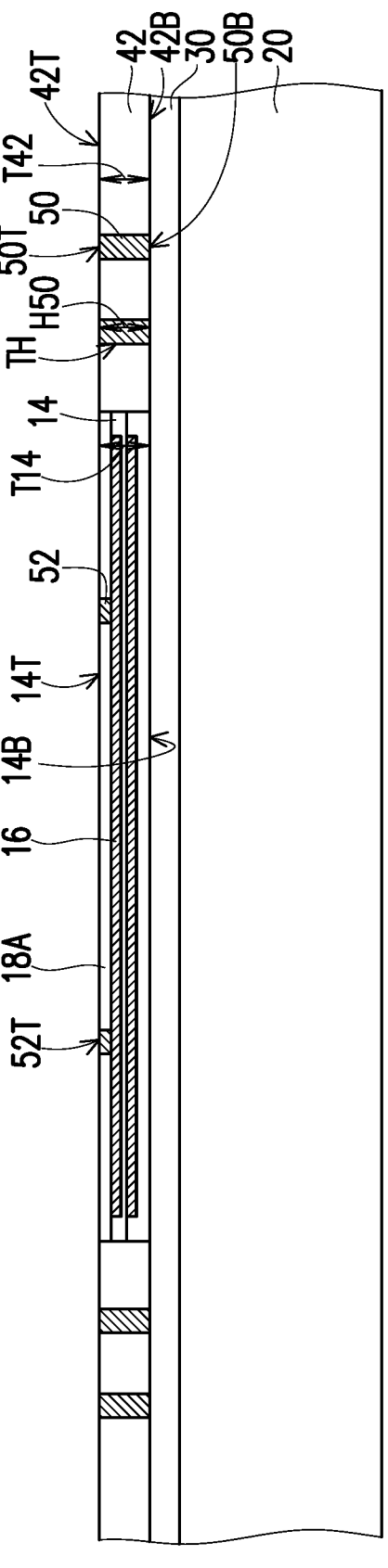

In FIG. 1E, through dielectric vias 50 are formed in the dielectric layer 42. In some embodiments, the dielectric layer 42 is patterned to form through holes TH by, for example, etching, milling, laser techniques, a combination thereof, and/or the like. Subsequently, metallic material such as copper, tungsten, aluminum, silver, gold, a combination thereof, and/or the like is formed to fill the through holes TH to form the through dielectric vias 50. Excess metallic material may be removed from the top 42T of the dielectric layer 42 by, for example, chemical mechanical polishing. Accordingly, the through dielectric vias 50 extend from the top 42T of the dielectric layer 42 to the bottom 42B of the dielectric layer 42. In some embodiments, the height H50 of each of the through dielectric vias 50 is identical to the thickness T42 of the dielectric layer 42 as well as the thickness T14 of the interconnect bridge 14. In some embodiments, the top 52T of the through dielectric via 50, the top 42T of the dielectric layer 42 and the top 14T of the interconnect bridge 14 are co-leveled and coplanar. In some embodiments, the bottom 50B of the through dielectric via 50, the bottom 42B of the dielectric layer 42 and the bottom 14B of the interconnect bridge 14 are co-leveled and coplanar. In addition, further vias 52 are formed in the interconnect bridge 14. The vias 52 may be formed by using the same method of forming the through dielectric vias 50. The vias 52 extend from the top 14T of the interconnect bridge 14 to the most adjacent layer of the interconnect wirings 16. For example, the vias 52 extend through the interlayer dielectric layer 18A. The tops 52T is co-leveled with and coplanar to the tops 50T of the through dielectric vias 50, the top 42T of the dielectric layer 42.

Figure 1F:
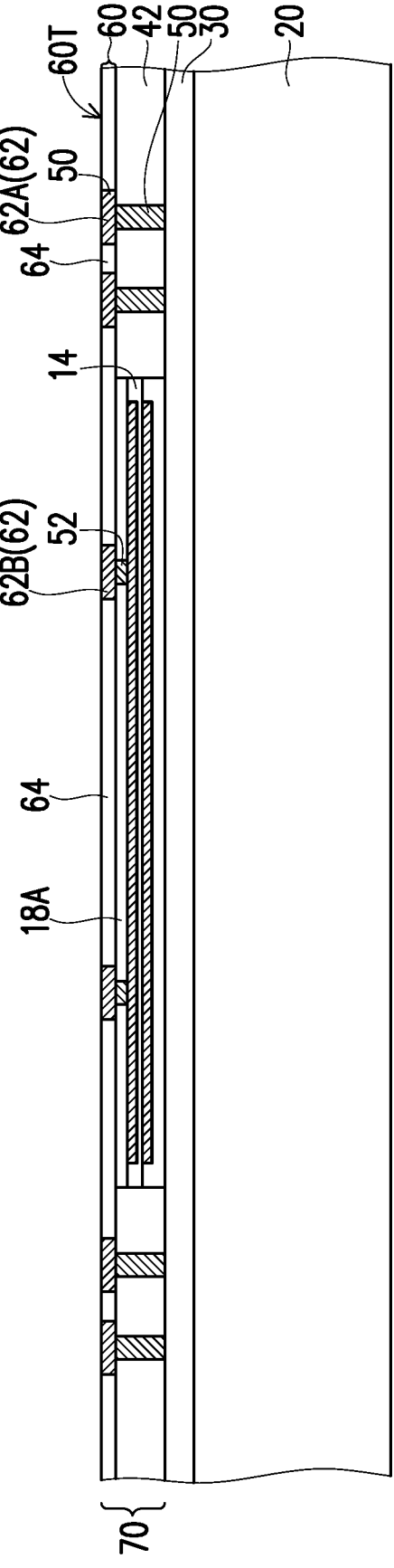

In FIG. 1F, a bonding structure 60 is formed on the interconnect bridge 14 and the dielectric layer 42 to form a bridge structure 70. In some embodiments, the bridge structure 70 including the interconnect bridge 14, the dielectric layer 42, the through dielectric vias 50 and the bonding structure 60 is form on the carrier 20 in a wafer form and is separated from the carrier 20 and optionally singulated to form an individual device in the subsequent steps. The bonding structure 60 includes bonding conductors 62 and bonding dielectric 64. The bonding conductors 62 include the bonding conductors 62A in contact with the through dielectric vias 50 and the bonding conductors 62B in contact with the vias 52 formed in the interconnect bridge 14. The bonding dielectric 64 extends between the bonding conductors 62 and covers the dielectric layer 42 and the interlayer dielectric layer 18A of the interconnect bridge 14. Accordingly, the bonding conductors 62 are surrounded by the bonding dielectric 64 and embedded in the bonding dielectric 64. The bonding conductors 62 are exposed at the top 60T of the bonding structure 60. In some embodiments, the bonding dielectric 64 may be silicon oxide (SiO$_x$, where x>0), silicon nitride (SiN$_x$, where x>0), silicon oxynitirde (SiO$_x$N$_y$, where x>0 and y>0) or other suitable dielectric material and may be formed by depositing a dielectric material through a chemical vapor deposition (CVD) process (e.g., a plasma enhanced CVD process or other suitable process). The bonding conductors 62 may be conductive vias (e.g., copper vias), conductive pads (e.g., copper pads) or combinations thereof.

Figure 1G:
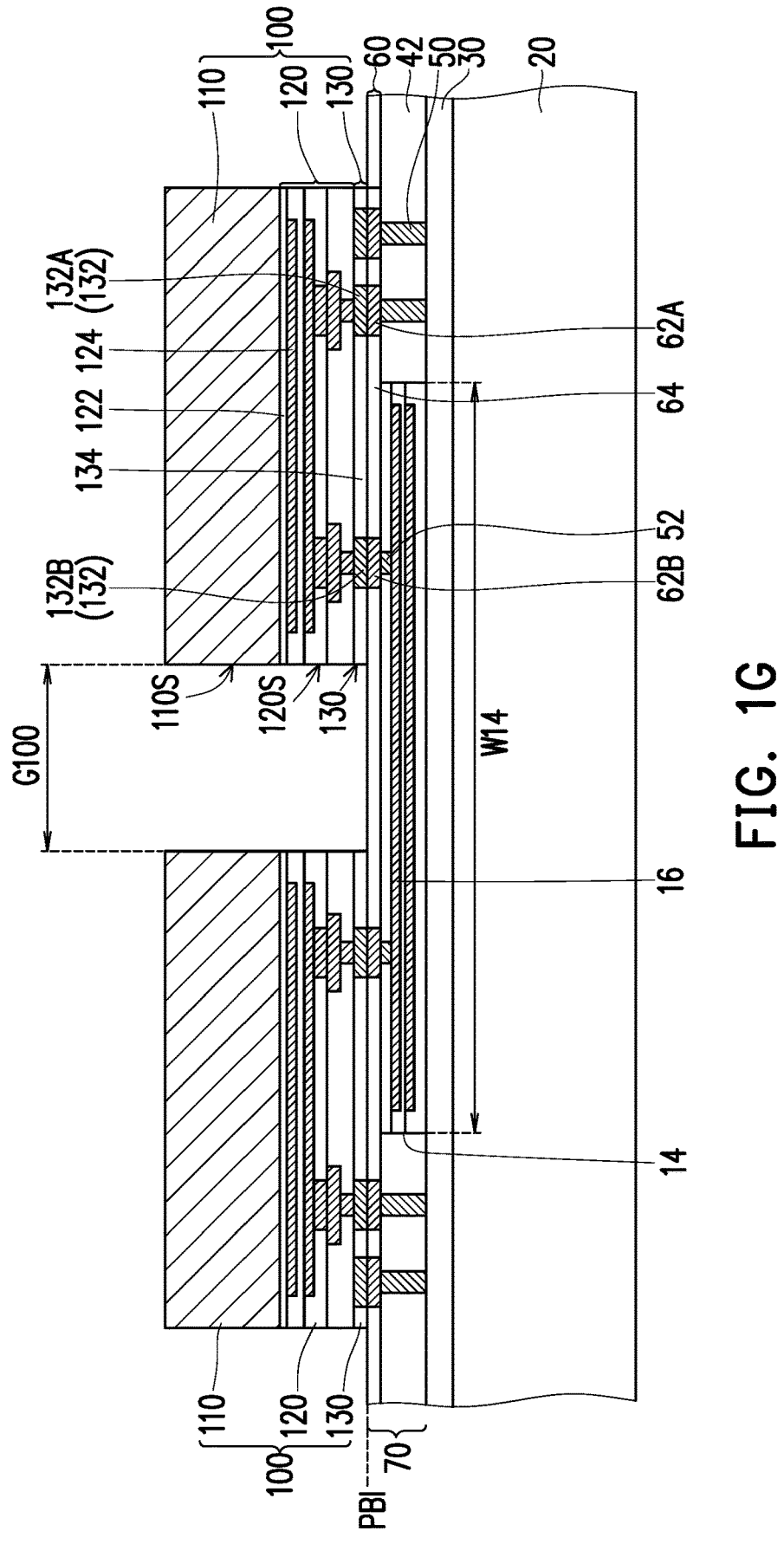

In FIG. 1G, semiconductor dies 100 are bonded to the bridge structure 70 and specifically connected to the interconnect bridge 14 and the dielectric layer 42. Each of the semiconductor dies 100 may be formed and singulated from a mother wafer and include a semiconductor substrate 110, an interconnect structure 120 and a bonding structure 130. The interconnect structure 120 is disposed on the semiconductor substrate 110 and the bonding structure 130 is disposed on the interconnect structure 120. The interconnect structure 120 is interposed between the semiconductor substrate 110 and the bonding structure 130. The sidewall 110S of the semiconductor substrate 110, the sidewall 120S of the interconnect structure 120 and the sidewall 130S of the bonding structure 130 are substantially coplanar. The semiconductor dies 100 are spaced from each other by a gap G100 and the interconnect bridge 140 laterally extends between the semiconductor dies 100 through the gap G100 to establish a connection bridge between the semiconductor dies 100. In addition, each of the semiconductor dies 100 overlaps both the interconnect bridge 14 and the dielectric layer 42. The bridge structure 70 provide lateral electric transmission paths between multiple semiconductor dies 100. Therefore, the semiconductor dies 100 are electrically connected to each other through the bridge structure 70.

The semiconductor substrate 110 includes a crystalline silicon wafer. The semiconductor substrate 110 includes various doped regions depending on design requirements (e.g., p-type substrate or n-type substrate). In some embodiments, the doped regions may be doped with p-type or n-type dopants. The doped regions may be doped with p-type dopants, such as boron or BF$_2$; n-type dopants, such as phosphorus or arsenic; and/or combinations thereof. The doped regions may be configured for n-type Fin-type Field Effect Transistors (FinFETs) and/or p-type FinFETs. In some alternative embodiments, the semiconductor substrate 110 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. The interconnect structure 120 may include one or more dielectric layers 122 (for example, one or more interlayer dielectric (ILD) layers, intermetal dielectric (IMD) layers, or the like) and interconnect wirings 124 embedded in the one or more dielectric layers 122, and the interconnect wirings 124 are electrically connected to the semiconductor devices (e.g., FinFETs) formed in the semiconductor substrate 110. The material of the one or more dielectric layers 122 may include silicon oxide (SiO$_x$, where x>0), silicon nitride (SiN$_x$, where x>0), silicon oxynitirde (SiO)$_x$N$_y$, where x>0 and y>0) or other suitable dielectric material. The interconnect wirings 124 may include metallic wirings. For example, the interconnect wirings 124 include copper wirings, copper pads, aluminum pads or combinations thereof.

The bonding structure 130 may include bonding conductors 132 and a bonding dielectric 134 surrounding the bonding conductors 132. The material of the bonding dielectric 134 may be silicon oxide (SiO$_x$, where x>0), silicon nitride (SiN$_x$, where x>0), silicon oxynitirde (SiO$_x$N$_y$, where x>0 and y>0) or other suitable dielectric material, and the bonding conductors 132 may be conductive vias (e.g., copper vias), conductive pads (e.g., copper pads) or combinations thereof. The bonding structure 130 may be formed by depositing a dielectric material through a chemical vapor deposition (CVD) process (e.g., a plasma enhanced CVD process or other suitable process); patterning the dielectric material to form the bonding dielectric 134 including openings or through holes; and filling conductive material in the openings or through holes defined in the bonding dielectric 134 to form the bonding conductors 132 embedded in the bonding dielectric 134.

The bonding conductors 132 of the bonding structure 130 include the bonding conductors 132A bonded to the bonding conductors 62A of the bonding structure 60 and the bonding conductors 132B bonded to the bonding conductors 62B. The bonding dielectric 134 of the bonding structure 130 is bonded to the bonding dielectric 64 of the bonding structure 60. Specifically, the bonding conductors 132A are in contact with the bonding conductors 62A, the bonding conductor 132B are in contact with the bonding conductors 62B, and the bonding dielectric 134 is in contact with the bonding dielectric 64, so that each semiconductor die 100 is bonded to the bridge structure 70 with a planar bonding interface PBI. In other words, the bonding conductor 132 and the bonding dielectric 134 are in contact with the bridge structure 70. The bonding conductors 62 and the bonding dielectric 64 are in contact with the semiconductor dies 100. In some embodiments, the bridge structure 70 optionally omits the bonding structure 60, and the semiconductor dies 100 are bonded to the interconnect bridge 14 and the dielectric layer 42 directly. In some embodiments, the semiconductor dies 100 are attached and bonded to the bridge structure 70 without a gap therebetween.

Figure 1H:
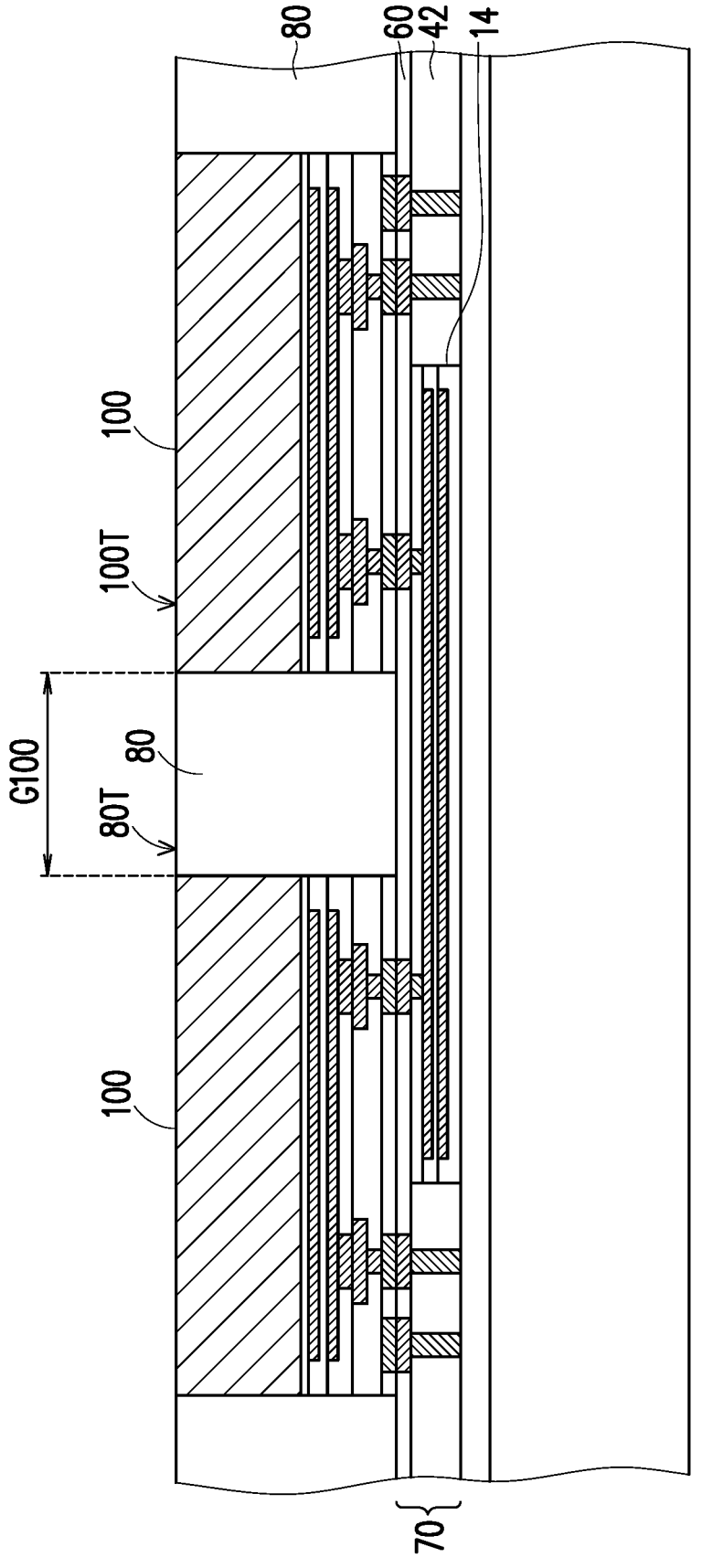

In FIG. 1H, a dielectric fill 80 is formed to fill the gap G100 between the semiconductor dies 100. The dielectric fill 80 is disposed on the bridge structure 70 and laterally surrounds the semiconductor dies 100. The dielectric fill 80 include an oxide, such as silicon oxide. In some alternative embodiments, the material of the dielectric fill 80 may be organic material (e.g., epoxy, polyimide (PI), polybenzoxazole (PBO), or the like), or the mixture of inorganic and organic materials (e.g., the mixture of silicon oxide and epoxy, or the like). In some alternative embodiments, the material of the dielectric fill 80 may include a molding compound, a molding underfill, a resin (such as epoxy resin), or the like. In some embodiments, the dielectric fill 80 may be formed through suitable fabrication techniques such as CVD, HDPCVD, PECVD, or atomic layer deposition (ALD). In some alternative embodiments, the dielectric fill 80 may be formed by a molding process, such as a compression molding process. In some embodiments, a planarization process such CMP or mechanical polishing process is performed to remove excess material of the dielectric fill 80 so that the top 80T of the dielectric fill 80 and the tops 100T od the semiconductor dies 100 are coplanar.

Figure 1I:
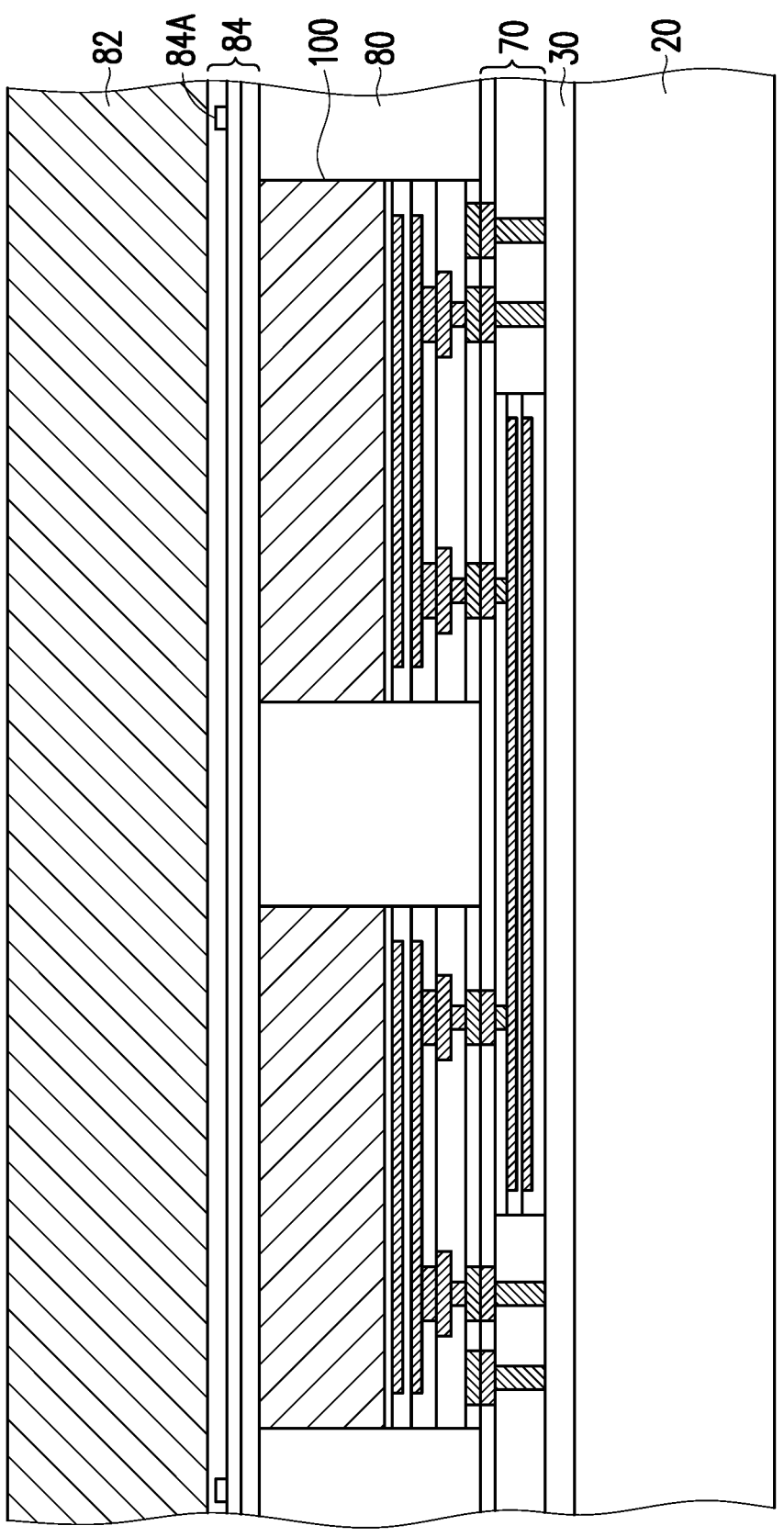

In FIG. 1I, a die support 82 is provided and the semiconductor dies 100 are attached to the die support 82. In some embodiments, one or more intermediate layer 84 is formed on the die support 82 in advance and the die support 82 is attached to the semiconductor dies 100 through the intermediate layers 84. The intermediate layers 84 include oxide material such as silicon oxide or the like. The intermediate layers 84 serve as buffer layers helpful for compensating the surface roughness of the semiconductor dies 100 and the dielectric fill 80 and ensuring the attachment of the semiconductor dies 100 and the dielectric fill 80 to the die support 82. In some embodiments, one or more alignment marks 84A is disposed in the intermediate layer 84 for facilitating the alignment operation in the subsequent steps. In some embodiments, the alignment mark 84A is optionally omitted. In some embodiments, the die support 82 is a semiconductor substrate such as a crystalline silicon substrate. The die support 82 has a wafer form in the current step and is cut to form individual device through the subsequent step such as a singulation operation.

Figure 1J:
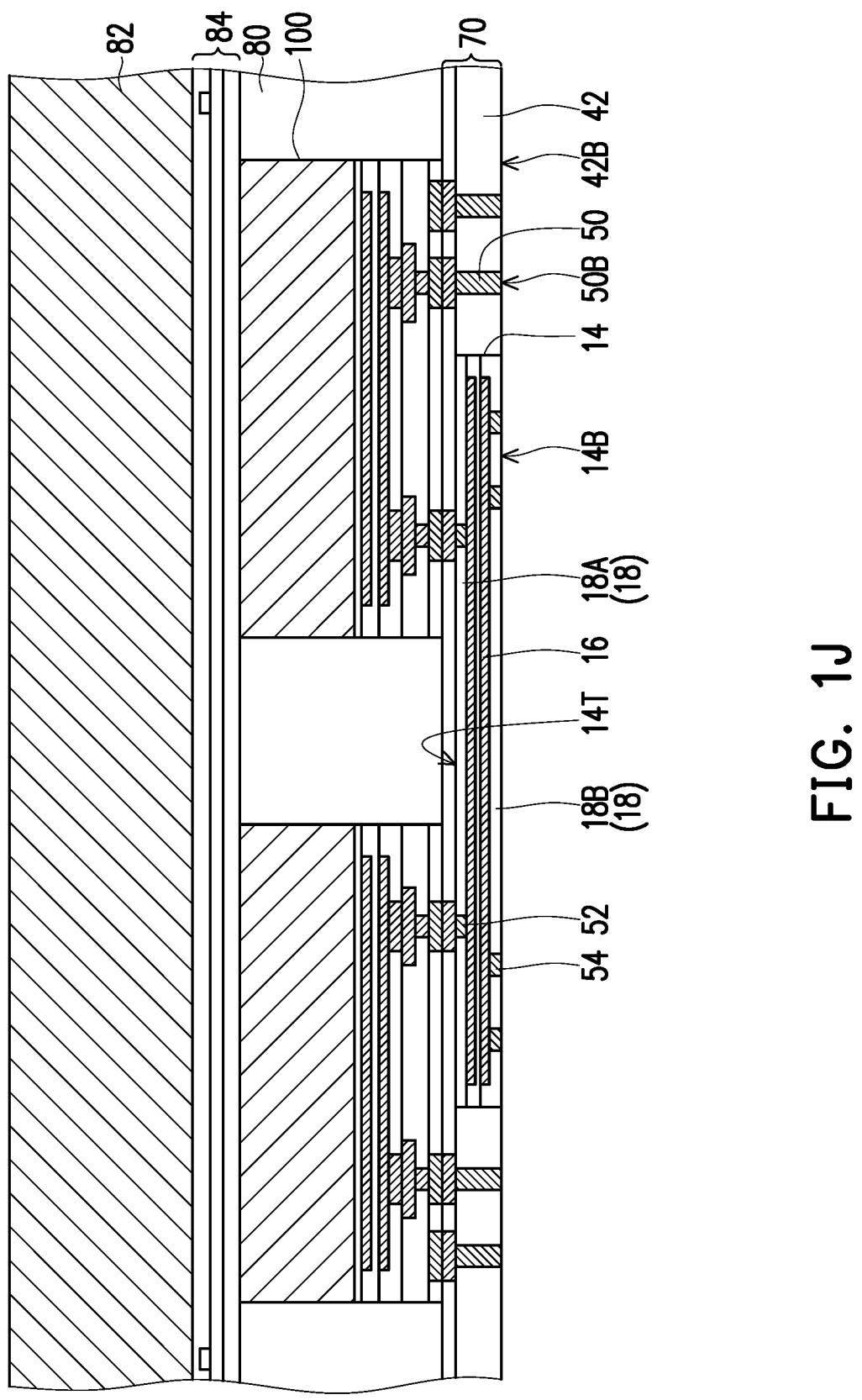

In FIG. 1J, the carrier 20 and the interface layer 30 are removed from the bridge structure 70. The bottom 14B of the interconnect bridge 14, the bottom 42B of the dielectric layer 42 and the bottom 50B of the through dielectric vias 50 are exposed. In addition, further vias 54 are formed in the interconnect bridge 14. Specifically, the vias 54 extend from the bottom 14B of the interconnect bridge 14 to a most adjacent layer of the interconnect wirings 16 in the interconnect bridge 14. In some embodiments, the vias 52 and the vias 54 are embedded in the interconnect bridge 14 and are formed through different steps, where the vias 52 are formed from the top 14T of the interconnect bridge 14 and the vias 54 are form from the bottom 14B of the interconnect bridge 14. In some embodiments, the vias 52 and the vias 54 may have taper shapes due to the formation process and the taper patterns of the vias 52 may be orient opposite to the taper patterns of the vias 54. For example, the tapper patterns of the vias 52 make the lateral dimension of the vias 52 gradually reduced in a direction away from the top 14T of the interconnect bridge 14 and the tapper patterns of the vias 54 make the lateral dimension of the vias 54 gradually reduced in a direction away from the bottom 14B of the interconnect bridge 14. In some embodiments, the vias 52 and the vias 54 may have vertical shapes.

Figure 1K:
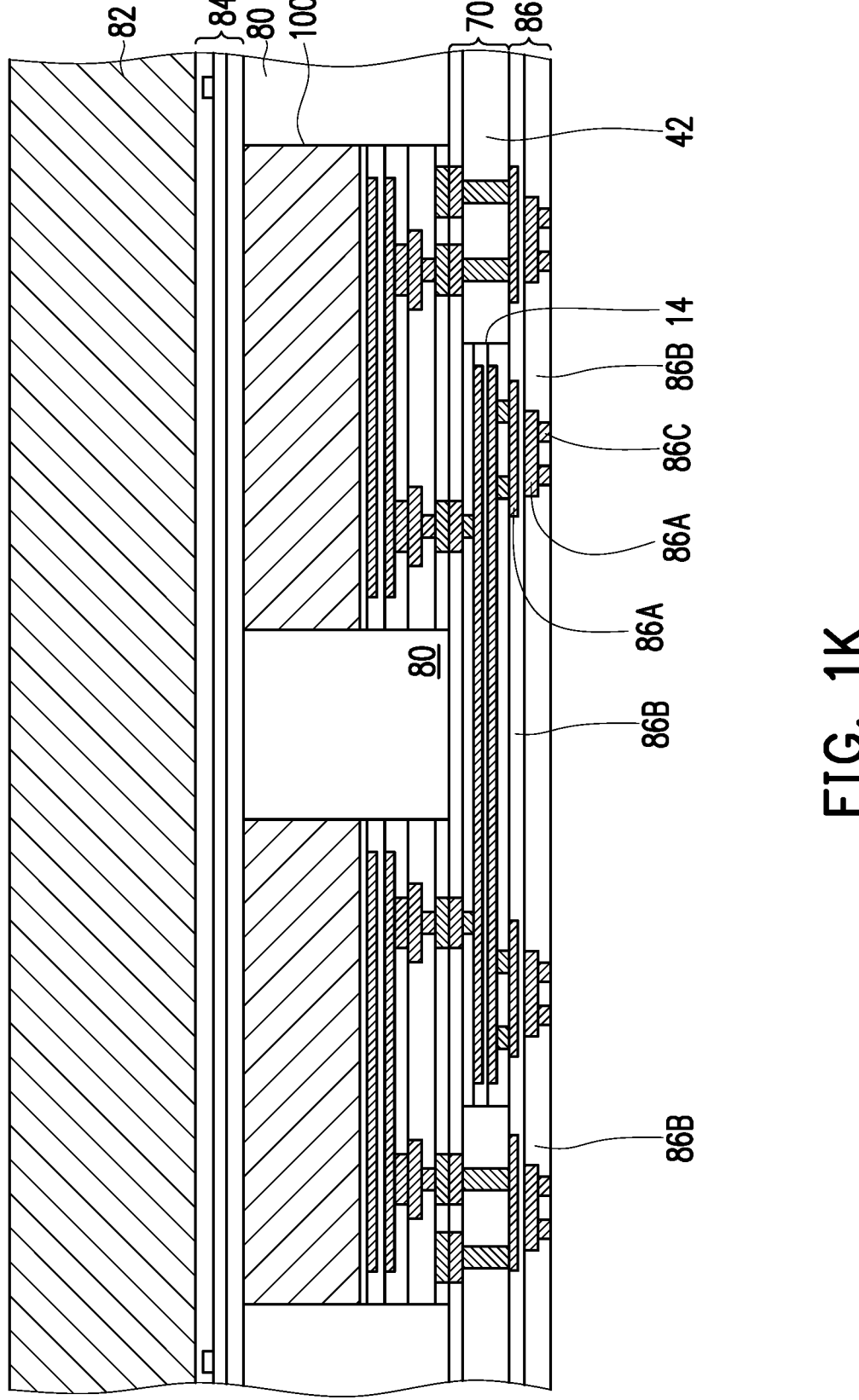

In FIG. 1K, a redistribution circuitry structure 86 is formed on the interconnect bridge 14 and the dielectric layer 42 of the bridge structure 70. The redistribution circuitry structure 86 is disposed on the bridge structure 70 and specifically on the bottom of the interconnect bridge 14 and the bottom of the dielectric layer 42. Therefore, the bridge structure 70 is interposed between the semiconductor dies 100 and the redistribution circuitry structure 86. The semiconductor dies 100 are electrically connected to the redistribution circuitry structure 86 through the bridge structure 70. The redistribution circuitry structure 86 includes redistribution wirings 86A, dielectric layers 86B and vias 86C. the redistribution wirings 86A are formed of a plurality of metallic layers separated by the dielectric layers 86B to establish the required electric transmission paths. The vias 86C are embedded in the dielectric layers 86B for connecting the redistribution wirings 86A in the thickness direction or connecting the redistribution wirings 86A to external components.

The formation of the redistribution wirings 86A may include forming a seed layer (not shown) over an underlying dielectric layer 86B, forming a patterned mask (not shown) such as a photoresist layer over the seed layer, and then performing a plating process on the exposed seed layer. The patterned mask and the portions of the seed layer covered by the patterned mask are then removed, leaving the redistribution wirings 86A. The seed layer includes a titanium layer and a copper layer over the titanium layer and may be formed using, for example, Physical Vapor Deposition (PVD). The plating may be performed using, for example, electroless plating. The redistribution wirings 86A may be copper wirings. In some embodiments, the dielectric layers 86B are formed of a polymer, which may also be a photosensitive material such as polybenzoxazole (PBO), polyimide, benzocyclobutene (BCB), or the like, which may be easily patterned using a photolithography process. In some embodiments, the dielectric layers 86B are formed of a nitride such as silicon nitride, an oxide such as silicon oxide, PhosphoSilicate Glass (PSG), BoroSilicate Glass (BSG), Boron-doped PhosphoSilicate Glass (BPSG), or the like. The vias 86C may be formed by patterning one of the dielectric layers 86B to form through holes therein and filling metallic material such as copper in the through holes to form the vias 86C. The through holes formed in one dielectric layer 86B may expose a portion of the underlying redistribution wirings 86A so that the vias 86C are electrically connected to the corresponding redistribution wirings 86A.

Figure 1L:
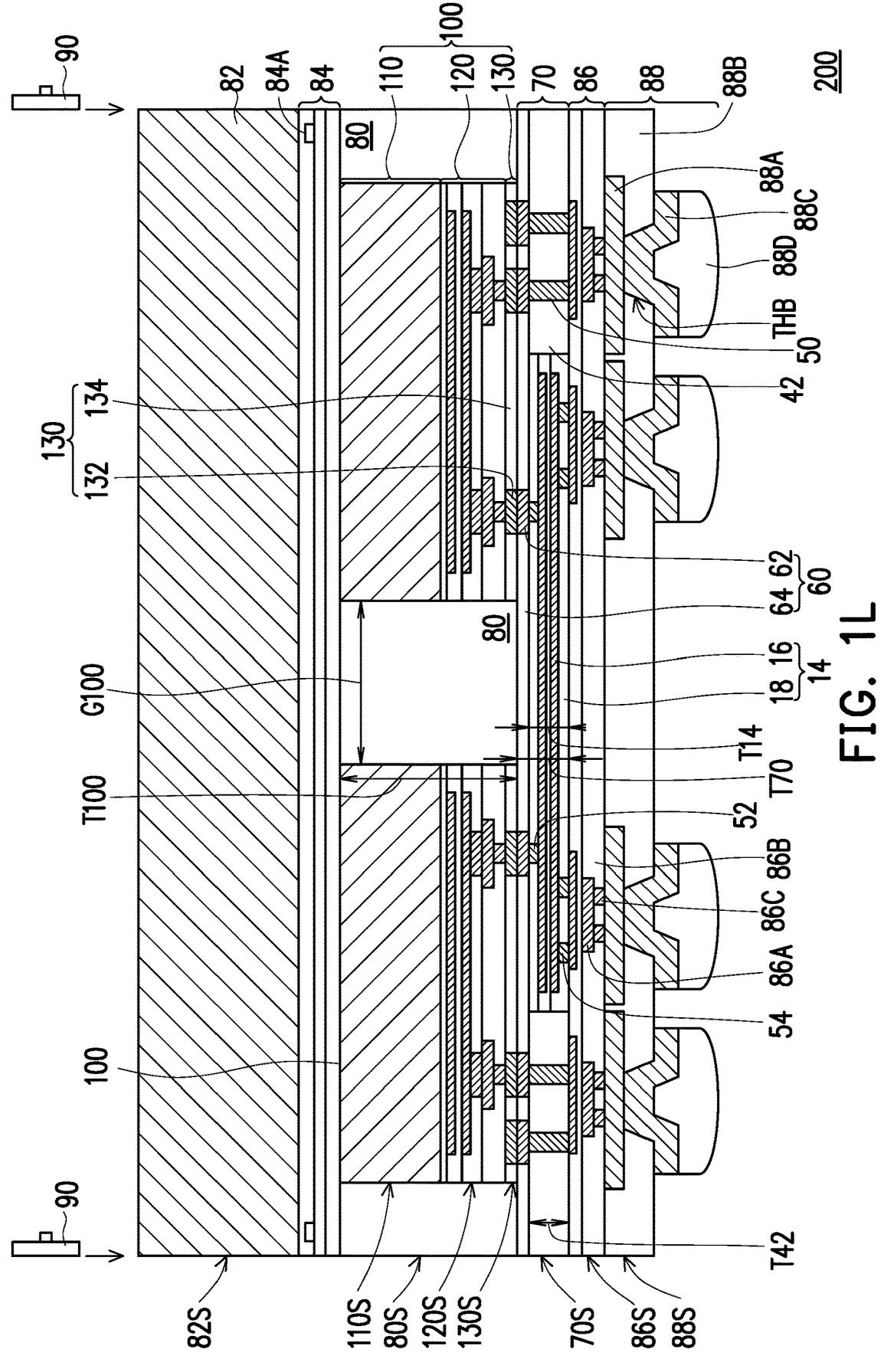

In FIG. 1L, an external bonding structure 88 is formed on the redistribution circuitry structure 86. The external bonding structure 88 includes conductive pads 88A disposed on the redistribution circuitry structure 86 and electrically connected to the outermost vias 86C, a dielectric layer 88B covering the conductive pads 88A, under bump metallurgies (UBMs)) 88C disposed on the dielectric layer 88B and connected to the conductive pads 88A, and conductive bumps 88D disposed on the UBMs 88C. In some embodiments, the conductive pads 88A include metallic material such as aluminum or the like. In some embodiments, the conductive pads 88A is formed on the outermost dielectric layer 86B by using the method of forming the redistribution wirings 86. The dielectric layer 88B includes a polymer layer formed to cover the conductive pads 88A and the outermost dielectric layer 86B. Through holes THB are formed in the dielectric layer 88B to uncover the conductive pads 88A and the UBMs 88C extend to the through holes THB to be in contact with the conductive pads 88A. The conductive bumps 88D are formed on the UBMs 88C, respectively.

In some embodiments, the formation of the UBMs 88C may include deposition and patterning. The formation of the conductive bumps 88D may include placing solder on the exposed portions of the UBMs 88C and then reflowing the solder to form solder balls. In some embodiments, the formation of the conductive bumps 88D includes performing a plating step to form solder regions and then reflowing the solder regions. The conductive bumps 88D may also include metal pillars or metal pillars and solder caps, which may also be formed through plating. After forming the external bonding structure 88, a singulation operation is performed to obtain a chip structure 200 by cutting the structure of FIG. 1L from a wafer form to a chip form using a dicing tool 90.

In FIG. 1L, the chip structure 200 includes a bridge structure 70, semiconductor dies 100, a die support 82, a redistribution circuitry structure 86 and an external bonding structure 88. The semiconductor dies 100 are connected and bonded to the bridge structure 70, disposed between the die support 82 and the bridge structure 70 and laterally encapsulated by the dielectric fill 80 to form an integer structure. Accordingly, the chip structure 200 includes two or more semiconductor dies 100 packaged in a one-piece form and is optionally served as an SoIC (system on integrated chip) structure. The semiconductor dies 100 may perform the same or different function based on the design requirements. The bridge structure 70 includes an interconnect bridge 14 and a dielectric layer 42 beside the interconnect bridge 14. The interconnect bridge 14 extends between the semiconductor dies 100 and the semiconductor dies 100 are electrically connected to each other through the interconnect bridge 14. The redistribution circuitry structure 86 is disposed on the bridge structure 70 and establishes the required electric transmission paths between the bridge structure 70 and the external bonding structure 88. The external bonding structure 88 is disposed on the redistribution circuitry structure 86 for bonding to an external component such as a circuit substrate, a package substrate or the like. In addition, the semiconductor dies 100 laterally surrounded by the dielectric fill 80 is attached to the die support 82 through one or more intermediate layer 84 in some embodiments. The sidewall 82S of the die support 82, the sidewall 80S of the dielectric fill 80, the sidewall 70S of the bridge structure 70, the sidewall 86S of the redistribution circuitry structure 86, and the sidewall 88S of the external bonding structure 88 are coplanar since the sidewalls are formed by sawing/dicing using the dicing tool 90.

In some embodiments, the bridge structure 70 includes the interconnect bridge 14, the dielectric layer 42, the through dielectric vias 50 and the bonding structure 60. The interconnect bridge 14 includes interconnect wirings 16 and interlayer dielectric layers 18 disposed between different layers of the interconnect wirings 16. The interconnect wirings 16 build the required electric transmission paths, for example, lateral electric transmission paths. The dielectric layer 42 is disposed beside the interconnect bridge 14 and laterally surround the interconnect bridge 14. The thickness T42 of the dielectric layer 42 is substantially identical to the thickness T14 of the interconnect bridge 14. The through dielectric vias 50 extend though the thickness T42 of the dielectric layer 42, i.e. from the top of the dielectric layer 42 to the bottom of the dielectric layer 42, and is formed embedded in the dielectric layer 42. The interconnect bridge 14 further includes the vias 52 and the vias 54 at opposite sides of the interconnect wirings 16 where the vias 52 electrically connect the corresponding interconnect wirings 16 to the bonding structure 60 and the vias 54 electrically connect the corresponding interconnect wirings 16 to the redistribution circuitry structure 86. The bonding structure 60 includes bonding conductors 62 are in contact with the through dielectric vias 50 embedded in the dielectric layer 42 and in contact with the vias 52 in the interconnect bridge 14.

Each of the semiconductor dies 100 includes a semiconductor substrate 110, an interconnect structure 120 and a bonding structure 130. The interconnect structure 120 is disposed on the semiconductor substrate 110 and interposed between the semiconductor substrate 110 and the bonding structure 130. The bonding structure 130 is bonded to the bonding structure 60 of the bridge structure 70. The bonding structure 130 includes bonding conductors 132 and a bonding dielectric 134 and the bonding conductors 132 are surrounded by and embedded in the bonding dielectric 134. The bonding conductors 132 are in contact with the bonding conductors 62 and the bonding dielectric 134 is in contact with the bonding dielectric 64. Accordingly, the semiconductor dies 100 are bonded to the bridge structure 70 through a metal to metal and dielectric to dielectric bonding technique. The bonding structure 130 provides a planar bonding surface bonding to the bridge structure 70 and the planar bonding surface substantially has an area identical to the area of the semiconductor die 100. In other words, no gap exists between the bonding structure 130 and the bonding structure 60. In some embodiments, the interconnect bridge 14 of the bridge structure 70 is connected to the semiconductor dies 100 through the bonding structure 60. In some embodiments, the interconnect bridge 14 is optionally connected to the semiconductor dies 100 directly while the bonding structure 60 is omitted.

The dielectric fill 80 is disposed between the die support 82 and the bridge structure 70. The dielectric fill 80 fills the gap G100 between the semiconductor dies 100 and is in contact with the sidewall 110S of the semiconductor substrate 110, the sidewall 120S of the interconnect structure 120 and the side wall 130S of the bonding structure 130. In some embodiments, the sidewall 120S of the interconnect structure 120 and the side wall 130S of the bonding structure 130 are coplanar so that the dielectric fill 80 has substantial straight edge line in the thickness direction.

Each of the semiconductor dies 100 overlaps both the interconnect bridge 14 and the dielectric layer 42 and the interconnect bridge 14 extends between adjacent semiconductor dies 100. The semiconductor dies 100 are electrically connected to the interconnect bridge 14 through the corresponding bonding conductors 62 in the bonding structure 60 and the interconnect bridge 14 establishes lateral electric transmission paths between the semiconductor dies 100. Accordingly, the semiconductor dies 100 are electrically connected to each other through the interconnect bridge 14 of the bridge structure 70. In addition, each of the semiconductor dies 100 are further electrically connected to at least one of the through dielectric vias 50 and thus are electrically connected to external components through the redistribution circuitry structure 86 and the external bonding structure 88. In some embodiments, the electric transmission path established by the through dielectric vias 50 is configured for transmitting electric power or the like, but the disclosure is not limited thereto. In some embodiments, the interconnect bridge 14 is optionally electrically connected to the external components through the vias 54, the redistribution circuitry structure 86 and the external bonding structure 88. Therefore, the semiconductor dies 100 are optionally electrically connected to the external component through the electric transmission path established by the interconnect bridge 14.

In some embodiments, a thickness T70 of the bridge structure 70 is 1 micrometer to 5 micrometers, or less and a thickness T100 is 15 micrometers to 25 micrometers. In some embodiments, the thickness T100 may be 3 times or 25 times of the thickness T70. Accordingly, the bridge structure 70 is a thin structure accomplishing the lateral electric connection between semiconductor dies 100 and thus the chip structure 200 has reduced thickness to achieve a compact size.

Figure 2:
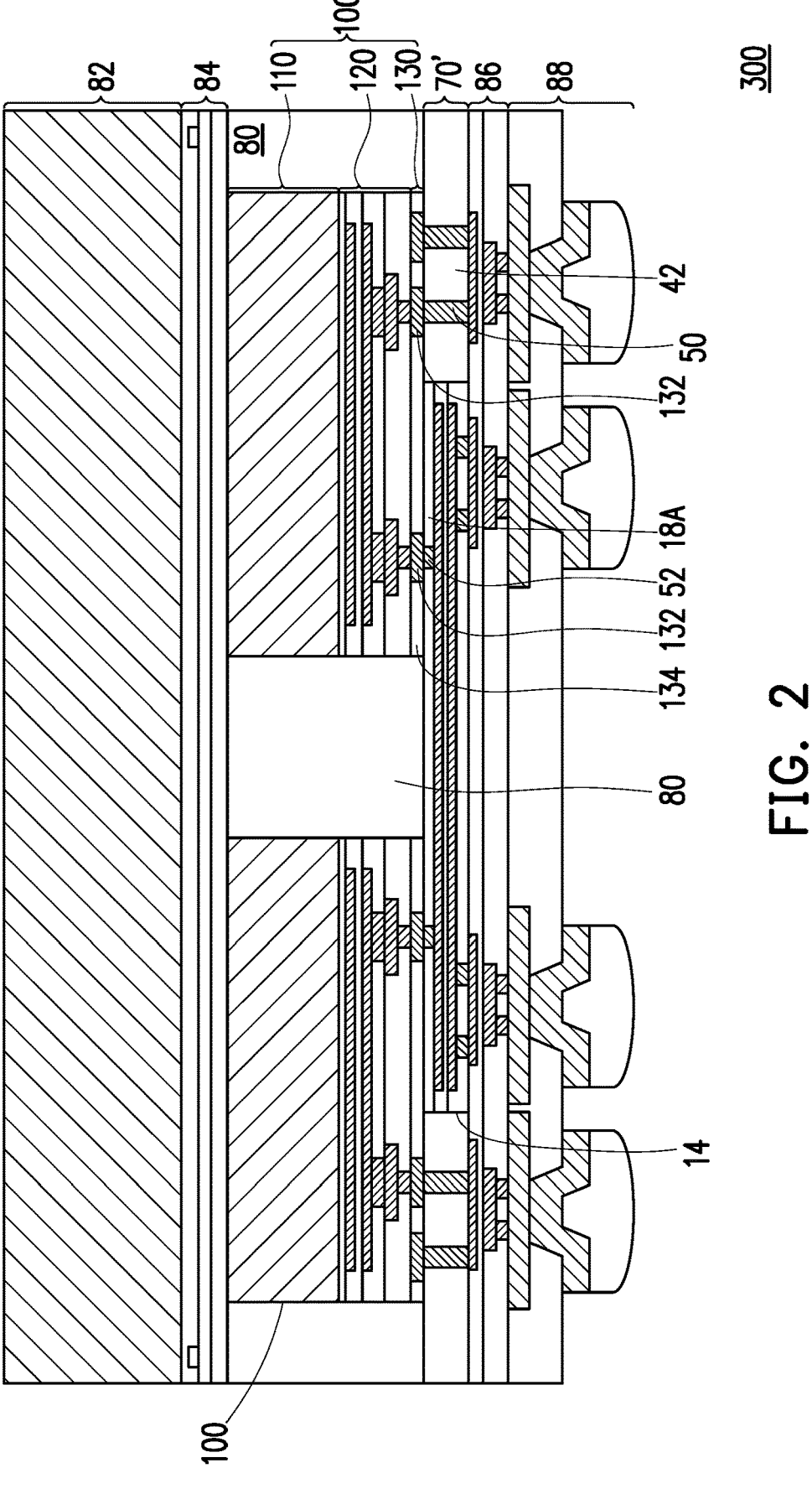
FIG. 2 schematically illustrate a chip structure in accordance with some embodiments of the disclosure.

FIG. 2 schematically illustrate a chip structure in accordance with some embodiments of the disclosure. In FIG. 2, a chip structure 300 is similar to the chip structure 200 depicted in FIG. 1L, but omits the bonding structure 60 shown in FIG. 1L. Specifically, the chip structure 300 includes semiconductor dies 100, a bridge structure 70', a support die 82, intermediate layers 84, a redistribution circuitry structure 86, an external bonding structure 88 and a dielectric fill 80. The semiconductor dies 100, the support die 82, the intermediate layers 84, the redistribution circuitry structure 86, the external bonding structure 88 and the dielectric fill 80 may refer to the descriptions for the same elements in the previous embodiments. The bridge structure 70' in the embodiment includes an interconnect bridge 14, a dielectric layer 42 and a through dielectric vias 50 and is different from the bridge structure 70 of FIG. 1L in that the bridge structure 70' omits the bonding structure 60.

In the embodiment, the semiconductor dies 100 are directly bonded to the interconnect bridge 14, the dielectric layer 42 and the through dielectric vias 50. For example, the bonding conductors 132 in the bonding structure 130 of the semiconductor die 100 are respectively bonded to and in contact with the vias 52 in the interlayer dielectric layer 18A of the interconnector bridge 14 and the through dielectric vias 50 in the dielectric layer 42. In addition, the bonding dielectric 134 of the bonding structure 130 in the semiconductor die 100 is bonded to and in contact with the interlayer dielectric layer 18A of the interconnect bridge 14 and the dielectric layer 42. In some embodiments, the lateral dimensions of the bonding conductors 132 is different from the lateral dimensions of the corresponding vias 52 and the corresponding dielectric vias 50 so that a portion of the bonding conductors 132 is partially in contact with the interlayer dielectric layer 18A or the dielectrically layer 42. The dielectric fill 80 between the semiconductor dies 100 is in contact with the interlayer dielectric layer 18A and the dielectric layer 42. The bridge structure 70' provides lateral electric transmission paths for electrically connecting the semiconductor dies 100 located beside each other. In addition, the through dielectric vias 50 provide electric transmission paths for electrically connecting the semiconductor dies 100 to the redistribution circuitry structure 86 and the bonding structure 88. In some embodiments, the electric transmission path established by the through dielectric vias 50 may transmit the electricity power and serve as an input/output interface.

Figure 3:
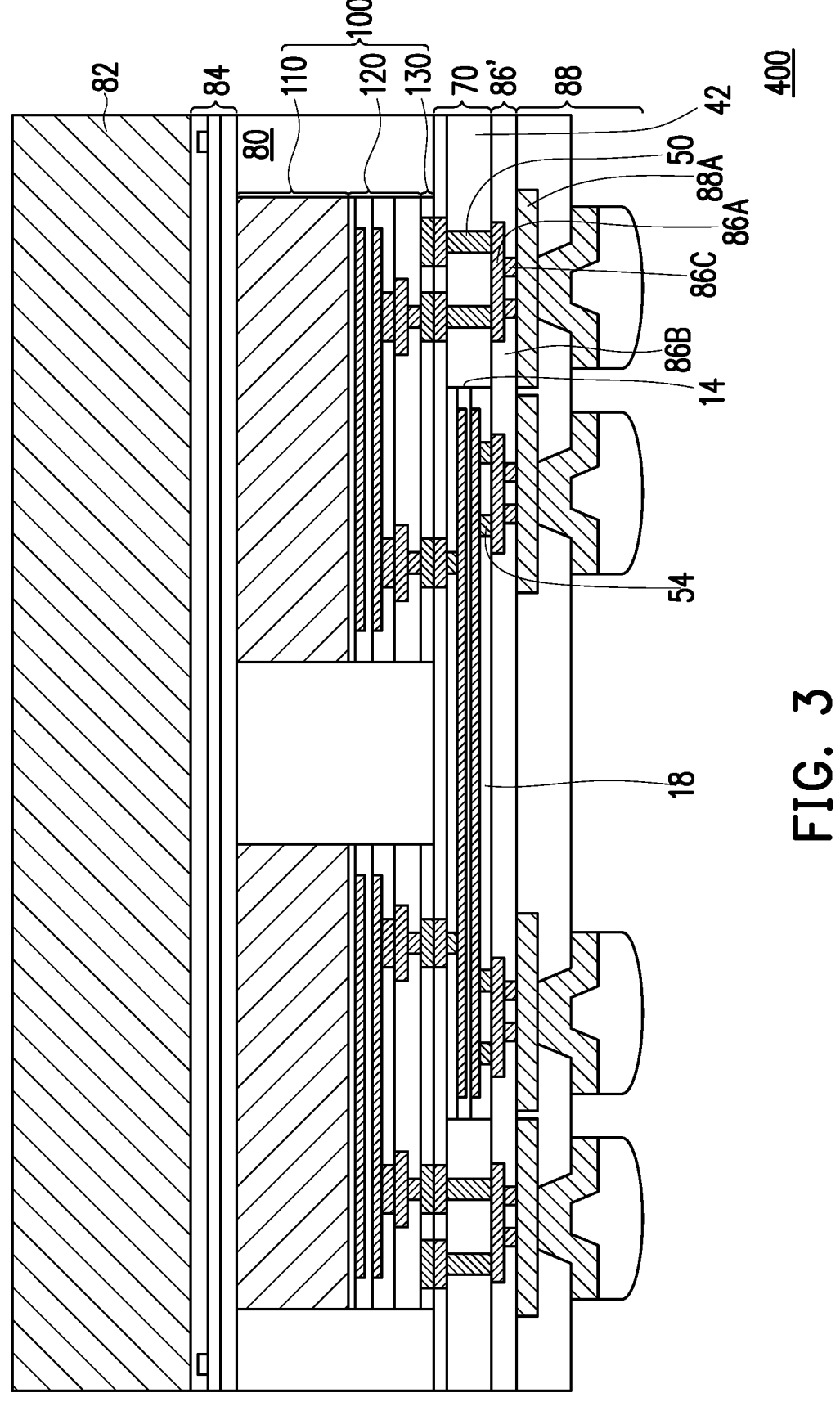
FIG. 3 schematically illustrated a chip structure in accordance with some embodiments of the disclosure.

FIG. 3 schematically illustrated a chip structure in accordance with some embodiments of the disclosure. In FIG. 3, a chip structure 400 is similar to the chip structure 200 depicted in FIG. 1L, but has a different redistribution circuitry structure 86' from that of the chip structure 100. Specifically, the chip structure 400 includes semiconductor dies 100, a bridge structure 70, a support die 82, intermediate layers 84, a redistribution circuitry structure 86', an external bonding structure 88 and a dielectric fill 80. The semiconductor dies 100, the bridge structure 70, the support die 82, the intermediate layers 84, the external bonding structure 88 and the dielectric fill 80 may refer to the descriptions for the same elements in the previous embodiments. The redistribution circuitry structure 86' is different from the redistribution circuitry structure 86 of FIG. 1L in that the redistribution circuitry structure 86' includes one single layer of redistribution wirings 86A, one single layer of dielectric layer 86B and one single layer of vias 86C. The vias 86C extend through the dielectric layer 86B to be in contact with the redistribution circuitry wiring 86A. The single layer of the redistribution wirings 86A is in contact with the through dielectric via 50 embedded in the dielectric layer 42 of the bridge structure 70 and the vias 54 embedded in the interlayer dielectric layer 18 of the interconnect bridge 14. The vias 86C extend between the redistribution wirings 86A and the conductive pads 88A of the external bonding structure 88.

Figure 4:
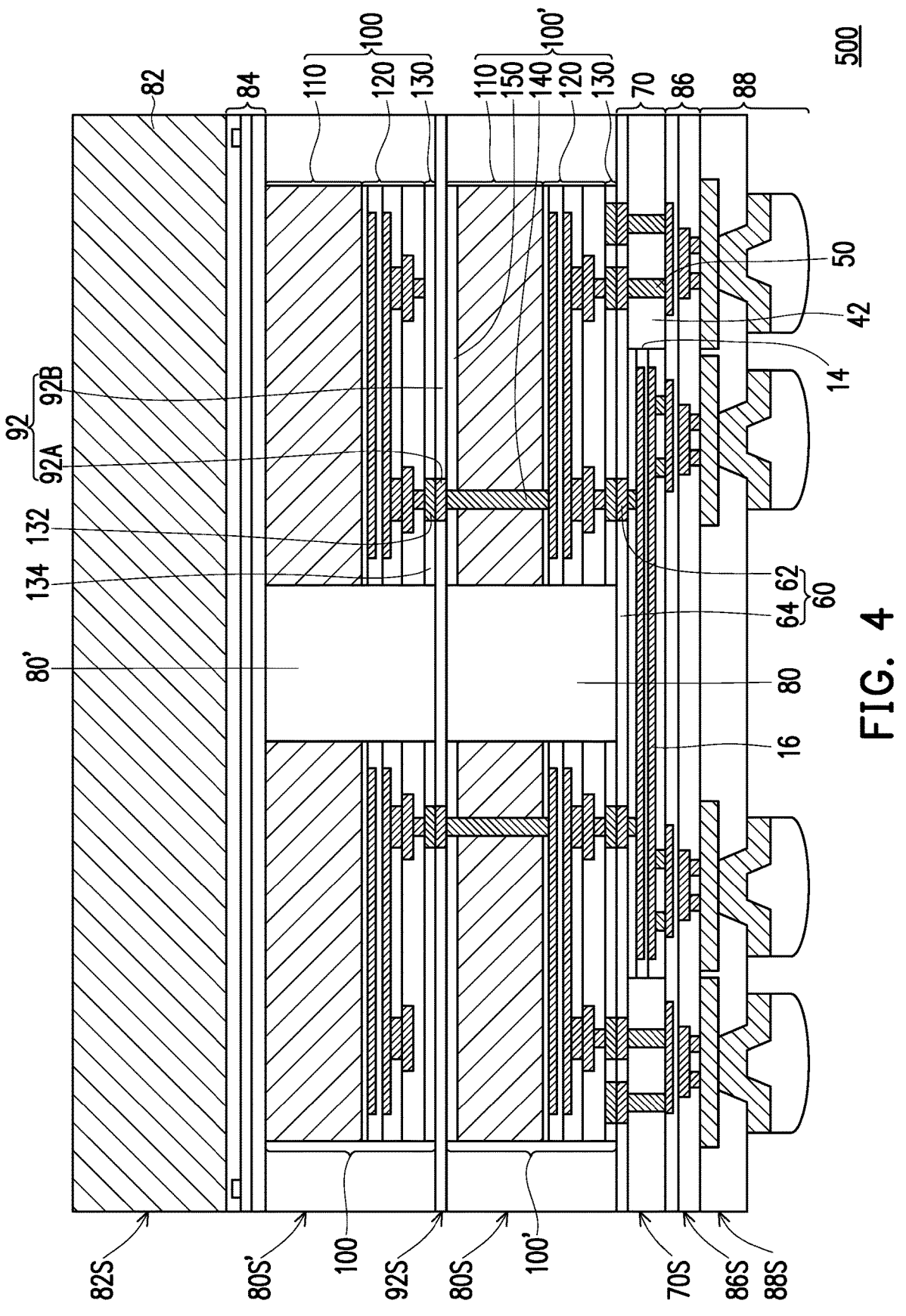
FIG. 4 schematically illustrates a chip structure in accordance with some embodiments of the disclosure.

FIG. 4 schematically illustrates a chip structure in accordance with some embodiments of the disclosure. In FIG. 4, a chip structure 500 is similar to the chip structure 200 shown in FIG. 1L but includes stacked semiconductor dies. Specifically, the chip structure 500 includes semiconductor dies 100, semiconductor dies 100', a bridge structure 70, a die support 82, a redistribution circuitry structure 86 and an external bonding structure 88. The semiconductor dies 100' are bonded to the bridge structure 70 to serve as $1^{st}$-tier dies while the semiconductor dies 100 are staked on the semiconductor dies 100' to serve as $2^{nd}$-tier dies. In addition, the chip structure 500 further include a bonding structure 92 formed on the $1^{st}$-tier dies (the semiconductor dies 100') for connecting the $1^{st}$-tier dies (the semiconductor dies 100') to the $2^{nd}$-tier dies (the semiconductor dies 100). As shown in FIG. 4, the dielectric fill 80 laterally surrounds the semiconductor dies 100' and the chip structure 500 further includes a further dielectric fill 80' laterally surrounds the semiconductor dies 100. The bonding structure 92 is interposed between the dielectric fill 80 and the dielectric fill 80'.

The chip structure 500 is optionally fabricated by the steps depicted in FIG. 1A to FIG. 1L, and additional steps of stacking the semiconductor dies 100 on the semiconductor dies 100'. Accordingly, the formations and the dispositions of the bridge structure 70, the die support 82, the redistribution circuitry structure 86 and the external bonding structure 88 may refer to the previous embodiments. In the embodiment, the step of FIG. 1G is performed by bonding the semiconductor dies 100' to the bridge structure 70, where the semiconductor die 100' includes the semiconductor substrate 110, the interconnect structure 120, and the bonding structure 130 that are described in the previous embodiment and further includes at least one through substrate via 140 and an isolation material layer 150. In addition, a die stacking operation is further performed to stacking the semiconductor die 100 on the semiconductor dies 100' between the step of FIG. 1H and the step of FIG. 1I.

In the embodiment, the semiconductor dies 100' are bonded to the bridge structure 70 using the method described in FIG. 1G and the dielectric fill 80 is subsequently formed to surround the semiconductor dies 100' as described in the step of FIG. 1H. In the embodiment, the semiconductor dies 100' includes the through substrate via (TSV) 140 and a TSV reveal process may be further performed after the step of FIG. 1H which includes bonding the semiconductor dies 100' to the bridge structure 70. In some embodiments, the TSV reveal process may include reducing the thickness of the semiconductor substrate 110 until the through substrate via 140 protrudes from the semiconductor substrate 110 and forming the isolation layer 150 surrounding the protruded portion of the through substrate via 140. In some embodiments, a planarization process is further performed so that the top of the isolation layer 150 and the top of the though substrate via 140 are coplanar. In addition, the TSV reveal process is optionally performed after the dielectric fill 80 filling the gap between the semiconductor dies 100' and the top of the dielectric fill 80 is optionally coplanar with the top of the through substrate vias 140 and the top of the isolation layer 150.

In the embodiment, the bonding structure 92 is formed after the TSV reveal process. The formation of the bonding structure 92 is similar to that of the bonding structure 60 in the bridge structure 70. The bonding structure 92 includes bonding conductors 92A and a bonding dielectric 92B. The bonding conductors 92A are embedded in the bonding dielectric 92B and in contact with the top of the through substrate via 140. The bonding dielectric 92B is in contact with the isolation layer 140 and the dielectric fill 80. The semiconductor dies 100 are bonded to the bonding structure 92 using the step similar to the step of FIG. 1G. In addition, a further dielectric fill 80' is formed to laterally surround the semiconductor dies 100 using the step similar to the step of FIG. 1H. Subsequently, the steps of FIG. 1I to FIG. 1L are performed to obtain the chip structure 500 in FIG. 4.

In the chip structure 500, one semiconductor die 100 is stacked on one semiconductor die 100' with the through substrate via 150. The semiconductor dies 100' are bonded to the bonding structure 60 of the bridge structure 70. The bridge structure 70 includes the interconnect bridge 14, dielectric layer 42 and the through vias 50. In addition, the bridge structure 70 is connected to the redistribution circuitry structure 86 and the redistribution circuitry structure 86 is connected to the external bonding structure 88. Accordingly, the semiconductor die 100 is electrically connected to external components through the through substrate via 140 in the semiconductor die 100', the bridge structure 70, the redistribution circuitry structure 86 and the external bonding structure 88. In addition, the semiconductor die 100 may be electrically connected to another semiconductor die 100 through the through substrate vias 140 in the semiconductor dies 100' and the interconnect bridge 14 of the bridge structure 70 since the interconnect bridge 14 establish lateral electric transmission paths between the semiconductor dies 100' through the interconnect wirings 16 therein.

The bonding structure 92 formed between the semiconductor die 100 and the semiconductor die 100' is similar to the bonding structure 60 formed in the bridge structure 70. The semiconductor die 100 includes the semiconductor substrate 110, the interconnect structure 120 and the bonding structure 130 that are described in the previous embodiments. The bonding structure 130 includes the bonding conductor 132 and the bonding dielectric 134. The semiconductor die 100 is bonded to the bonding structure 92 by bonding the bonding conductor 132 to the bonding conductor 92A and bonding the bonding dielectric 134 to the bonding dielectric 92B. A planar bonding interface is formed between the semiconductor die 100' and the bonding structure 92.

In the embodiment, the semiconductor dies 100 are attached to the die support 82. In addition, the intermediate layers 84 are optionally disposed between the semiconductor dies 100 and the die support 82. The chip structure 500 is singulated form a wafer form structure. The sidewall 82S of the die support 82, the sidewall 80S' of the dielectric fill 80', the sidewall 92S of the bonding structure 92, the sidewall 80S of the dielectric fill 80, the sidewall 70S of the bridge structure 70 (that includes the sidewall of the bonding dielectric 62 and the sidewall of the dielectric layer 42), the sidewall 86S of the redistribution circuitry structure 86 and the sidewall 88S of the external bonding structure 88 are coplanar.

Figure 7:
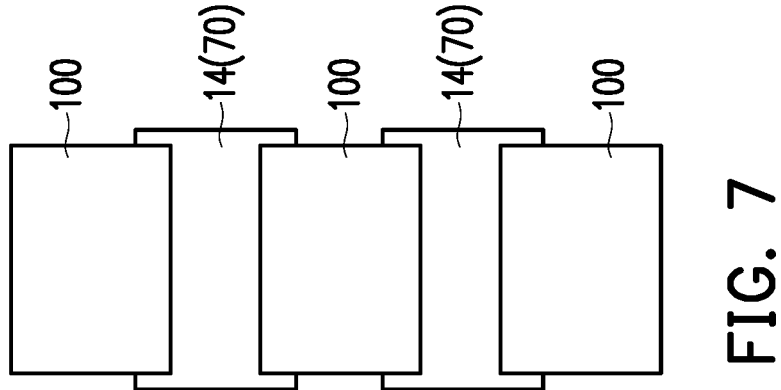
FIGS. 5 to 7 schematically illustrate the relationship between semiconductor dies and bridge structure in accordance with some embodiments of the disclosure.
Figure 6:
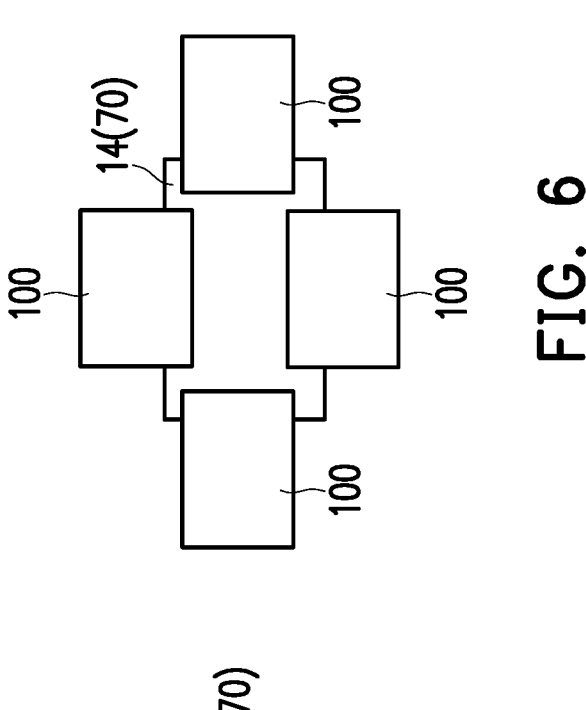
Figure 5:
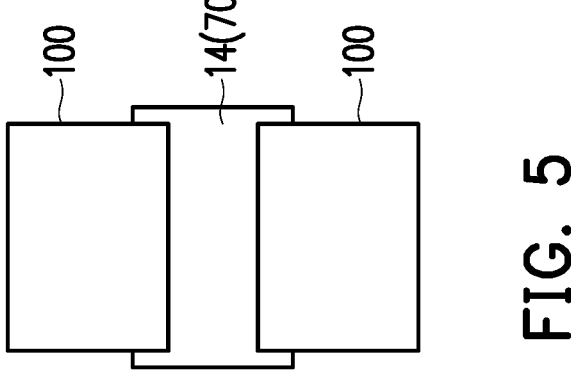

FIGS. 5 to 7 schematically illustrate the relationship between semiconductor dies and bridge structure in accordance with some embodiments of the disclosure. In FIG. 5, in a chip structure, two semiconductor dies 100 are arranged beside each other, the bridge structure 70 is located between the two semiconductor dies 100 and the two semiconductor dies 100 are electrically connected to each other through the interconnect bridge 14 of the bridge structure 70. In FIG. 6, in a chip structure, four semiconductor dies 100 are arranged beside one another, and the interconnect bridge 14 of the bridge structure 70 is surrounded by the semiconductor dies 100. Each of the semiconductor dies 100 is electrically connected to one or more other semiconductor dies 100 through the interconnect bridge 14 of the bridge structure 70. In FIG. 7, in a chip structure, three semiconductor dies 100 are arranged in a linear path and two bridge structures 70 having the interconnect bridges 14 are adopted. Each of the bridge structures 70 is located between two of the semiconductor dies 100 and establish electric transmission path between the two semiconductor dies 100. Accordingly, the three semiconductor dies 100 are electrically to one another through the interconnect bridges 14 of the bridge structures 70. In FIGS. 5 to 7, the structures, the dispositions, and the formations of the semiconductor dies 100 and the bridge structures 70 may refer to the previous embodiments.

In some embodiments of the disclosure, two or more semiconductor dies are bonded to a bridge structure including interconnect bridge to form a chip structure. The bridge structure is a substrate-less structure and includes a dielectric layer and an interconnect structure surrounded by the dielectric layer, where the interconnect structure establishes lateral electric transmission path between the semiconductor dies so as to serve as an interconnect bridge. The bridge structure is obviously thinner than the semiconductor die since the bride structure is a substrate-less structure. The chip structure thus has a compact size, for example, a thin volume. In some embodiments, the bridge structure also facilitates the electric transmission in the thickness direction through at least the through dielectric via embedded in the dielectric layer beside the interconnect bridge. Accordingly, the bridge structure electrically connects the semiconductor dies to an external component. In some embodiments, the semiconductor dies of the chip structure involves the same or different functions and the chip structure is optionally served as an SoIC with a thin bridge structure.

In accordance with some other embodiments of the disclosure, a chip structure includes a bridge structure including an interconnect bridge, a dielectric layer laterally surrounding the interconnect bridge and through dielectric vias extending from a top of the dielectric layer to a bottom of the dielectric layer, wherein a thickness of the interconnect bridge is identical to a height of each of the through dielectric vias; semiconductor dies disposed on the bridge structure, wherein each of the semiconductor dies overlaps both the interconnect bridge and the dielectric layer and is electrically connected to the interconnect bridge and at least one of the through dielectric vias; and a die support, the semiconductor dies being disposed between the die support and the bridge structure, wherein a sidewall of the die support is coplanar with a sidewall of the bridge structure. A top of the interconnect bridge is co-leveled with the top of the dielectric layer. A bottom of the interconnect bridge is co-leveled with the bottom of the dielectric layer. Each of the semiconductor dies comprises a semiconductor substrate, an interconnect structure disposed on the semiconductor substrate, and a bonding structure disposed on the interconnect structure, and the boding structure comprises bonding conductors and a bonding dielectric surrounding the bonding conductors. The bonding conductors and the bonding dielectric of the bonding structure are in contact with the bridge structure. The bridge structure further comprises a bonding structure disposed on the interconnect bridge and the dielectric layer, the boding structure comprises bonding conductors and a bonding dielectric laterally surrounding the bonding conductors, and the bonding conductors and the bonding dielectric are in contact with the semiconductor dies. A redistribution circuitry structure is further disposed on the bridge structure, wherein the bridge structure is interposed between the semiconductor dies and the redistribution circuitry structure. A dielectric fill is further disposed on the bridge structure and laterally surrounding the semiconductor dies, wherein a sidewall of the dielectric fill is coplanar to the sidewall of the bridge structure and the sidewall of the die support.

In accordance with some other embodiments of the disclosure, a chip structure includes a die support; semiconductor dies disposed on the die support, each of the semiconductor dies comprises a semiconductor substrate, an interconnect structure and a bonding structure, wherein the interconnect structure is connected between the semiconductor substrate and the bonding structure, the bonding structure comprises a bonding dielectric and bonding conductors embedded in the bonding dielectric; an interconnect bridge extending between the semiconductor dies and connected to the bonding structure of each of the semiconductor dies; a dielectric layer beside the interconnect bridge, wherein a bottom of the dielectric layer is co-leveled with a bottom of the interconnect bridge; a redistribution circuitry structure disposed on the bottom of the interconnect bridge and the bottom of the dielectric layer, wherein a sidewall of the die support, a sidewall of the dielectric layer and a sidewall of the redistribution circuitry structure are coplanar. The interconnect bridge comprises interlayer dielectric layers and conductive wirings between the interlayer dielectric layers, and one of the interlayer dielectric layers is co-leveled with the bottom of the dielectric layer. A thickness of the interconnect bridge is identical to a thickness of the dielectric layer. A dielectric fill is further included to laterally surround the semiconductor dies, wherein a sidewall of the dielectric fill is coplanar to the sidewall of the dielectric layer. The dielectric fill is in contact with a sidewall of the bonding structure. A sidewall of the semiconductor substrate, a sidewall of the interconnect structure, and a sidewall of the bonding structure are coplanar.

In accordance with some other embodiments of the disclosure, a method of fabricating a chip structure including: attaching a bridge die to a carrier, wherein the bridge die comprises a semiconductor substrate and an interconnect bridge formed on the semiconductor substrate; removing the semiconductor substrate to remain the interconnect bridge on the carrier; forming a dielectric layer on the carrier, wherein the dielectric layer is beside the interconnect bridge; connecting semiconductor dies to the interconnect bridge and the dielectric layer, wherein the interconnect bridge laterally extends between the semiconductor dies; and attaching the semiconductor dies on a die support and removing the carrier. The dielectric layer is formed on the carrier by forming a dielectric material layer to cover the interconnect bridge and performing a planarization operation until the interconnect bridge is exposed. Through dielectric vias are further formed in the dielectric layer, wherein a thickness of the interconnect bridge is identical to a height of each of the through dielectric vias. A redistribution circuitry structure is further formed on the interconnect bridge and the dielectric layer. A singulation operation is further performed, wherein a sidewall of the dielectric layer and a sidewall of the die support are coplanar. The semiconductor dies are bonded to the interconnect bridge through a bonding structure, and the bonding structure comprises a bonding dielectric and bonding conductors surrounded by the bonding dielectric. A gap is filled between the semiconductor dies using a dielectric fill.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip structure, comprising:
a bridge structure comprising an interconnect bridge, a dielectric layer laterally surrounding the interconnect bridge and through dielectric vias extending from a top of the dielectric layer to a bottom of the dielectric layer, wherein a thickness of the interconnect bridge is identical to a height of each of the through dielectric vias;
semiconductor dies disposed on the bridge structure, wherein each of the semiconductor dies overlaps both the interconnect bridge and the dielectric layer and is electrically connected to the interconnect bridge and at least one of the through dielectric vias;
a die support, the semiconductor dies being disposed between the die support and the bridge structure, wherein a sidewall of the die support is coplanar with a sidewall of the bridge structure; and
a dielectric fill disposed on the bridge structure and laterally surrounding the semiconductor dies, wherein a sidewall of the dielectric fill is coplanar to the sidewall of the bridge structure and the sidewall of the die support.

2. The chip structure of claim 1, wherein a top of the interconnect bridge is co-leveled with the top of the dielectric layer.

3. The chip structure of claim 1, wherein a bottom of the interconnect bridge is co-leveled with the bottom of the dielectric layer.

4. The chip structure of claim 1, wherein each of the semiconductor dies comprises a semiconductor substrate, an interconnect structure disposed on the semiconductor substrate, and a bonding structure disposed on the interconnect structure, and the boding structure comprises bonding conductors and a bonding dielectric surrounding the bonding conductors.

5. The chip structure of claim 4, wherein the bonding conductors and the bonding dielectric of the bonding structure are in contact with the bridge structure.

6. The chip structure of claim 1, wherein the bridge structure further comprises a bonding structure disposed on the interconnect bridge and the dielectric layer, the boding structure comprises bonding conductors and a bonding dielectric laterally surrounding the bonding conductors, and the bonding conductors and the bonding dielectric are in contact with the semiconductor dies.

7. The chip structure of claim 1, further comprising a redistribution circuitry structure disposed on the bridge structure, wherein the bridge structure is interposed between the semiconductor dies and the redistribution circuitry structure.

8. The chip structure of claim 1, wherein the dielectric fill is interposed between the bridge structure and the die support.

9. A chip structure, comprising:
a die support;

semiconductor dies disposed on the die support, each of the semiconductor dies comprises a semiconductor substrate, an interconnect structure and a bonding structure, wherein the interconnect structure is connected between the semiconductor substrate and the bonding structure, the bonding structure comprises a bonding dielectric and bonding conductors embedded in the bonding dielectric;

an interconnect bridge extending between the semiconductor dies and connected to the bonding structure of each of the semiconductor dies;

a dielectric layer beside the interconnect bridge, wherein a bottom of the dielectric layer is co-leveled with a bottom of the interconnect bridge;

a redistribution circuitry structure disposed on the bottom of the interconnect bridge and the bottom of the dielectric layer, wherein a sidewall of the die support, a sidewall of the dielectric layer and a sidewall of the redistribution circuitry structure are coplanar; and a dielectric fill laterally surrounding the semiconductor dies, wherein a sidewall of the dielectric fill is coplanar to the sidewall of the dielectric layer.

10. The chip structure of claim 9, wherein the interconnect bridge comprises interlayer dielectric layers and conductive wirings between the interlayer dielectric layers, and one of the interlayer dielectric layers is co-leveled with the bottom of the dielectric layer.

11. The chip structure of claim 9, wherein a thickness of the interconnect bridge is identical to a thickness of the dielectric layer.

12. The chip structure of claim 9, wherein the dielectric fill and the redistribution circuitry structure are disposed at opposite sides of the dielectric layer.

13. The chip structure of claim 12, wherein the dielectric fill is in contact with a sidewall of the bonding structure.

14. The chip structure of claim 9, wherein a sidewall of the semiconductor substrate, a sidewall of the interconnect structure, and a sidewall of the bonding structure are coplanar.

15. A method of fabricating a chip structure, comprising: attaching a bridge die to a carrier, wherein the bridge die comprises a semiconductor substrate and an interconnect bridge formed on the semiconductor substrate; removing the semiconductor substrate to remain the interconnect bridge on the carrier; forming a dielectric layer on the carrier, wherein the dielectric layer is beside laterally surrounding the interconnect bridge; forming through dielectric vias extending from a top of the dielectric layer to a bottom of the dielectric layer, wherein a thickness of the interconnect bridge is identical to a height of each of the through dielectric vias; connecting disposing semiconductor dies on the interconnect bridge and the dielectric layer, wherein each of the semiconductor dies overlaps both the interconnect bridge and the dielectric layer and is electrically connected to the interconnect bridge and at least one of the through dielectric vias the interconnect bridge laterally extends between the semiconductor dies; attaching the semiconductor dies on a die support and removing the carrier, wherein the semiconductor dies are disposed between the die support and the bridge structure, and a sidewall of the die support is coplanar with a sidewall of the bridge structure; and forming a dielectric fill disposed on the bridge structure and laterally surrounding the semiconductor dies, wherein a sidewall of the dielectric fill is coplanar to the sidewall of the bridge structure and the sidewall of the die support.

16. The method of claim 14, wherein the dielectric layer is formed on the carrier by forming a dielectric material layer to cover the interconnect bridge and performing a planarization operation until the interconnect bridge is exposed.

17. The method of claim 14, further forming a redistribution circuitry structure on the interconnect bridge and the dielectric layer.

18. The method of claim 14, further performing a singulation operation, wherein a sidewall of the dielectric layer and the sidewall of the die support are coplanar.

19. The method of claim 14, wherein the semiconductor dies are bonded to the interconnect bridge through a bonding structure, and the bonding structure comprises a bonding dielectric and bonding conductors surrounded by the bonding dielectric.

20. The method of claim 14, further filling a gap between the semiconductor dies using the dielectric fill.

* * * * *